(12) United States Patent
Benavides (10) Patent No.: US 6,618,827 B1
(45) Date of Patent: Sep. 9, 2003

(54) SYSTEM AND METHOD FOR PARALLEL TESTING OF IEEE 1149.1 COMPLIANT INTEGRATED CIRCUITS

(75) Inventor: John A. Benavides, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/549,233

(22) Filed: Apr. 13, 2000

(51) Int. Cl.[7] .............................................. G01R 31/28
(52) U.S. Cl. ....................................... 714/726; 714/729
(58) Field of Search .................................. 714/727, 726, 714/731, 724, 736, 744; 324/73.1; 327/144; 333/100

(56) References Cited

U.S. PATENT DOCUMENTS

| | | | | |
|---|---|---|---|---|
| 5,701,309 A | * | 12/1997 | Gearhardt et al. ........... | 714/736 |
| 5,740,181 A | * | 4/1998 | Heikes et al. ................ | 714/731 |
| 5,757,819 A | * | 5/1998 | Segars ......................... | 714/727 |
| 5,774,474 A | * | 6/1998 | Narayanan et al. .......... | 714/726 |
| 5,790,561 A | * | 8/1998 | Borden et al. ............... | 714/724 |
| 5,809,036 A | * | 9/1998 | Champlin ................... | 324/73.1 |
| 5,872,793 A | * | 2/1999 | Attaway et al. ............. | 714/726 |
| 6,000,051 A | * | 12/1999 | Nadeau-Dostie et al. ... | 327/144 |
| 6,023,778 A | * | 2/2000 | Li ................................ | 714/726 |
| 6,105,157 A | * | 8/2000 | Miller ......................... | 333/100 |
| 6,314,539 B1 | * | 11/2001 | Jacobson et al. ........... | 714/727 |
| 6,430,718 B1 | * | 8/2002 | Nayak ......................... | 714/727 |
| 6,446,230 B1 | * | 9/2002 | Chung ........................ | 714/726 |

* cited by examiner

Primary Examiner—Albert Decady
Assistant Examiner—Mujtaba Chaudry (57) ABSTRACT

The present invention is generally related to a system and method for conducting parallel testing of IEEE1149.1 compliant integrated circuits hardware via comparing results generated by integrated circuits under evaluation in accordance with IEEE1149.1 JTAG/IEEE standard test access port and boundary scan architecture provisions, with a master reference signal to determine whether the integrated circuit is functioning properly. There is provided a multi-input scan chain select unit for receiving a selected group of integrated circuit test data inputs. There is provided a comparator unit for comparing each of the selected integrated circuit test data inputs with a predetermined reference signal and determining whether they are the same or not. Malfunctioning integrated circuits are identified based upon results of the comparison.

19 Claims, 11 Drawing Sheets

SYSTEM AND METHOD FOR PARALLEL TESTING OF IEEE 1149.1 COMPLIANT INTEGRATED CIRCUITS

TECHNICAL FIELD

The present invention is generally related to system and method for conducting parallel testing of IEEE 1149.1 compliant integrated circuits hardware via comparing results generated by integrated circuits under evaluation in accordance with IEEE 1149.1 JTAG/IEEE standard test access port and boundary scan architecture provisions, with a master reference signal to determine whether the integrated circuit is functioning properly.

BACKGROUND OF THE INVENTION

It is common for integrated circuits to be tested and/or evaluated using standard test access port provisions complying with the IEEE 1149.1 (JTAG) standard. JTAG compliant integrated circuits provide for a four wire test access port (test bus), or TAP, which is used to convey serial-test information to the integrated circuit. The TAP provides for a system clock (synchronization) signal TCK, a state control signal TMS, a test data input signal TDI and a test data output signal TDO. Test instructions, test data and test control signals all are passed along to the TAP. The TAP controller of the IEEE 1149.1 compliant integrated circuit monitors two signals from the TAP bus master. These are the synchronization signal (TCK) and the state control signal (TMS). The TAP bus master can be an external test system such as automatic test equipment (ATE) or an embedded system that might be part of a system maintenance architecture.

In order to test each JTAG compliant integrated circuit, it is necessary for the TAP of each integrated circuit to be provided with test instructions, test data and test control signals. The test data output (TDO) of each integrated circuit is then read out and compared with expected results. The expected results may be predetermined or calculated by the TAP bus master. Where TDO is compared and determined to be the same as the expected results, it is then known that the integrated circuit under evaluation is functioning properly. Likewise, where TDO is determined to be different than TDI, it is then known that the integrated circuit under evaluation is not functioning properly.

Where there are large numbers of identical integrated circuits in a system which require testing via the same test instructions, test data and test control signals, each integrated circuit typically is individually tested one after the other. As the number of integrated circuits to be tested increases, so does the time required to carry out such testing activities.

Integrated circuits can be tested concurrently. However, this requires additional separate test systems to test each integrated circuit within the system at the same time. This does save time, however due to the necessary replication of test systems for each integrated circuit, or type of integrated circuit, to be tested and it can be expensive and require additional floor space to accommodate the replicated testing systems.

SUMMARY OF THE INVENTION

The present invention provides an apparatus and technique for providing parallel testing of multiple IEEE 1149.1 compliant integrated circuits. Briefly described, in architecture, the system can be implemented as follows. A preferred embodiment of the present invention incorporates a chain select unit for receiving test data signal output from an integrated circuit under evaluation. A delay adjustment unit is provided for synchronizing the received test data signal with a reference signal as may be needed to account for propagation (link) delays between the device under test and the test unit; and a comparator unit is provided for comparing the received test data signal with a master reference signal to determine if the signals are the same or not. The master reference signal can be, for example, a selected output from one of the multiple IEEE 1149.1 compliant integrated circuits being tested. Further, the master reference signal could be another predetermined signal source.

The present invention can also be viewed as providing a method for providing identification information to a connected system that requires such identification information. In this regard, the method can be broadly summarized by the following steps: receiving input of test data from a plurality of IEEE 1149.1 compliant integrated circuits, and; simultaneously comparing the received input test data with a master reference signal to determine if the received input test data is the same as the master reference signal.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

The present invention is directed to providing system and method for testing a plurality of JTAG compliant integrated circuits with common test instructions, test data and test control signals, in parallel, so as to reduce the overall time and effort necessary to complete testing of all integrated circuits of interest. More particularly, the present invention can be used to interrogate a plurality of integrated circuit chips of a particular type with the same, concurrently provided test data. The disclosure of IEEE standard 1149.1 is hereby incorporated herein by reference.

Figure 1:
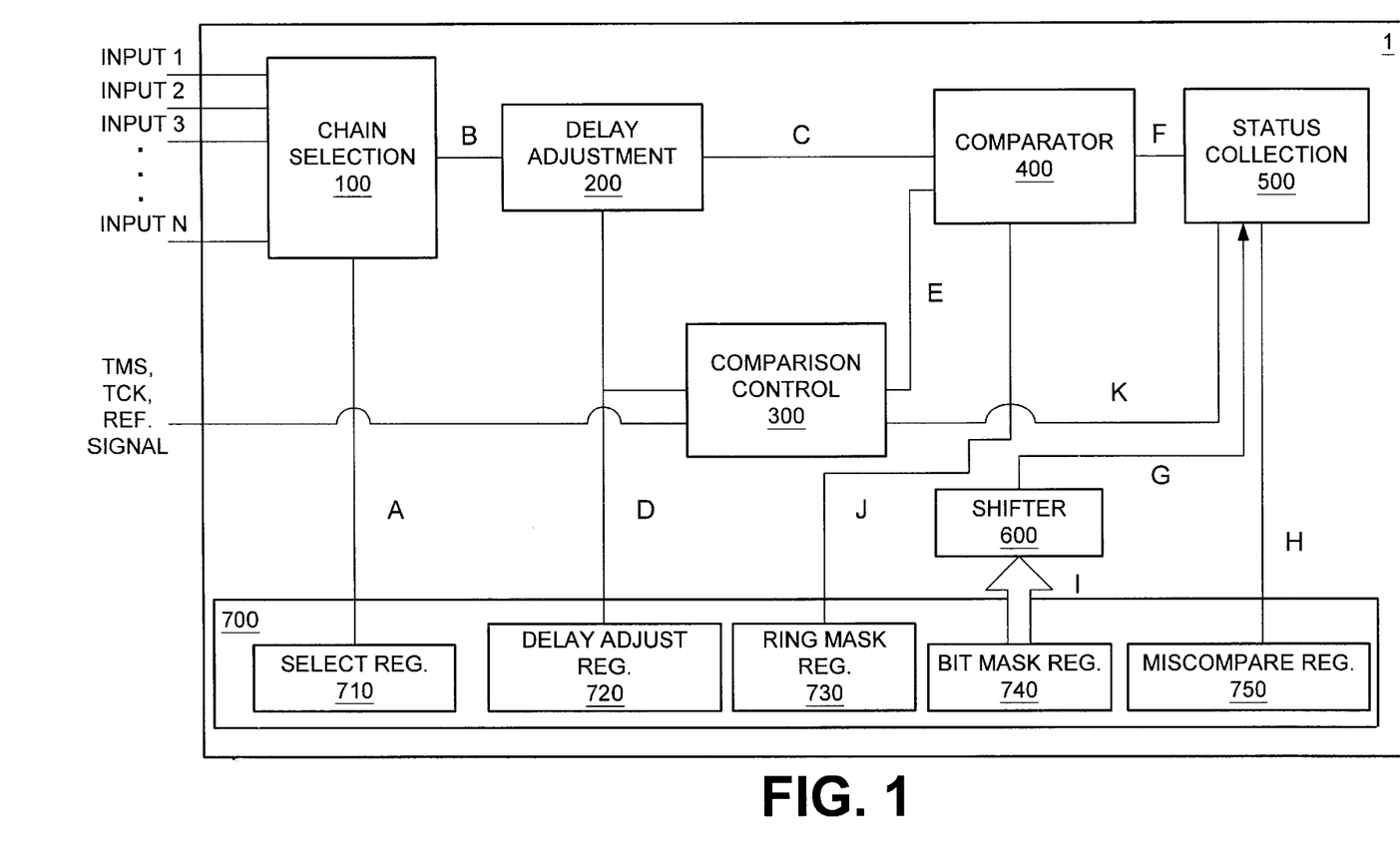
FIG. 1 is a block diagram of a preferred embodiment of the present invention.

With reference to FIG. 1, there is shown a parallel test unit 1. Parallel test unit 1 includes a chain selection unit 100 for selectively receiving the test data output (TDO) from a plurality of IEEE 1149.1 compliant integrated circuits under evaluation via inputs INPUT 1–INPUT N. It should be understood that each input (INPUT 1 through INPUT N) provides for the input of multiple signals from integrated circuits. For example, INPUT 1 may receive multiple parallel input signals from integrated circuits of a first particular type (or group), while INPUT 2 receives multiple parallel input signals from integrated circuits of a second particular type. In order to accommodate multiple parallel inputs for each INPUT 1–INPUT N, it is necessary to replicate the circuitry for each integrated circuit of a type to be evaluated in parallel. Thus, when INPUT 1 is selected, there are multiple separate inputs from integrated circuits of a particular type (or group) selected and processed in parallel. Chain selection unit 100 selectively outputs test data outputs B (FIGS. 2, 3) to delay adjustment unit 200 in accordance with data stored in select register 710.

Delay adjustment unit 200 synchronizes the selected TDO inputs in accordance with instruction data stored in delay adjustment register 720. Instruction data may either instruct that a delay be added to the test data output B or not. The adjusted signal C (FIG. 3) is then output to comparator unit 400.

Figure 4:
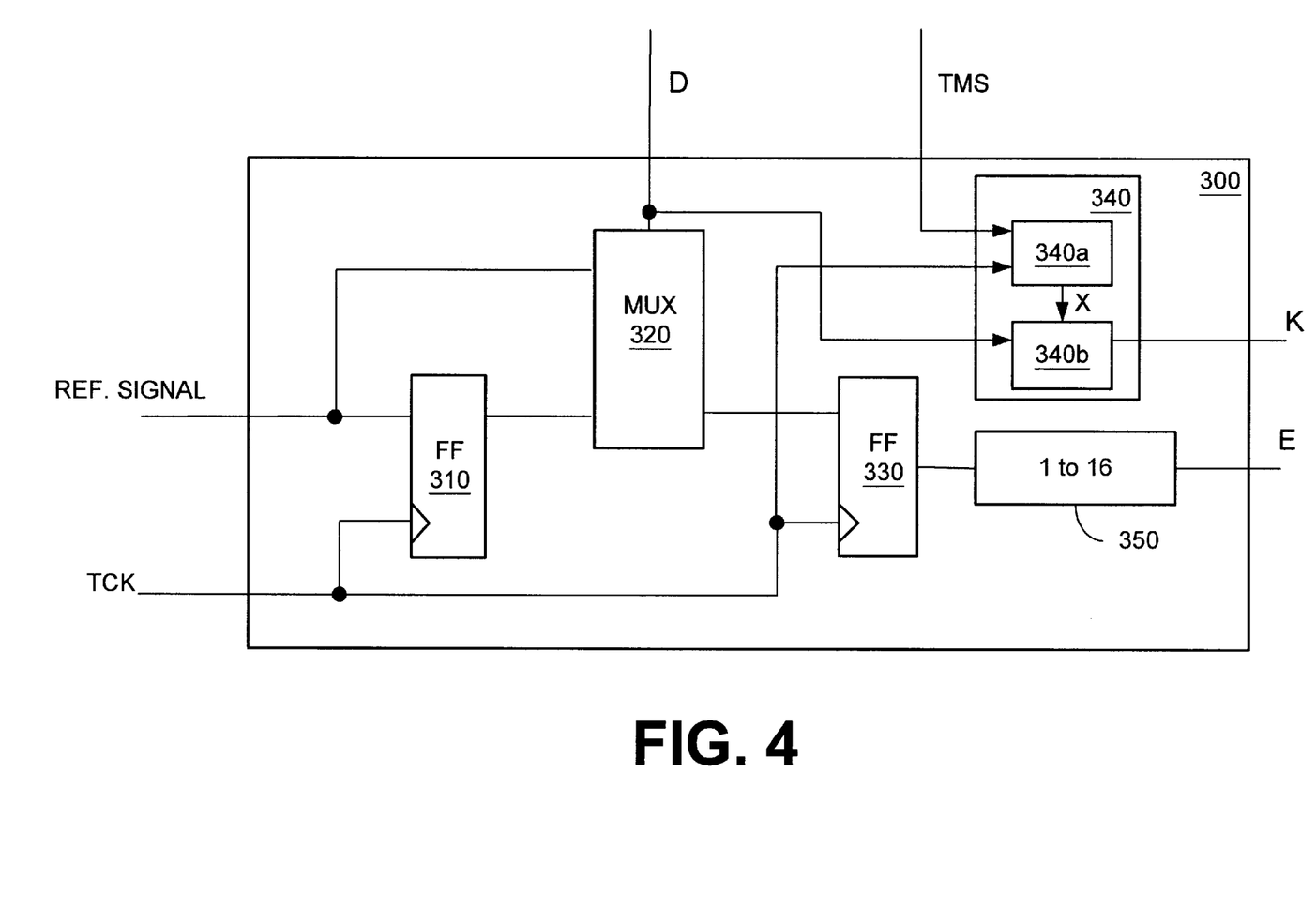
FIG. 4 illustrates a preferred embodiment of a comparator control unit of the present invention

Comparator unit 400 compares the input signals C from delay adjustment unit 200 with a master signal E generated by comparison control unit 300. Comparison control unit 300 generates master signal E in accordance with test data output (signal D), a test-mode select (TMS) input, and a test-clock (TCK) input. Comparator unit 400 generates a comparison signal F (FIG. 5) indicating whether or not the test data output C is the same as the master signal E. When the comparison signal F indicates that the test data output C is the same as the master signal E, the integrated circuit under evaluation is functioning properly. Otherwise, when comparator unit 400 generates a signal output F indicating that the integrated circuit under evaluation is not the same, then the integrated circuit under evaluation has malfunctioned. Output F is generated in accordance with data provided via signals C, E and J from ring mask register 730. The output F from comparator unit 400 is provided to the status collection unit 500 that then outputs data to miscompare register 750 in accordance with signal G from bit mask register 740 and signal K (FIG. 4) comparison control 300.

Figure 2:
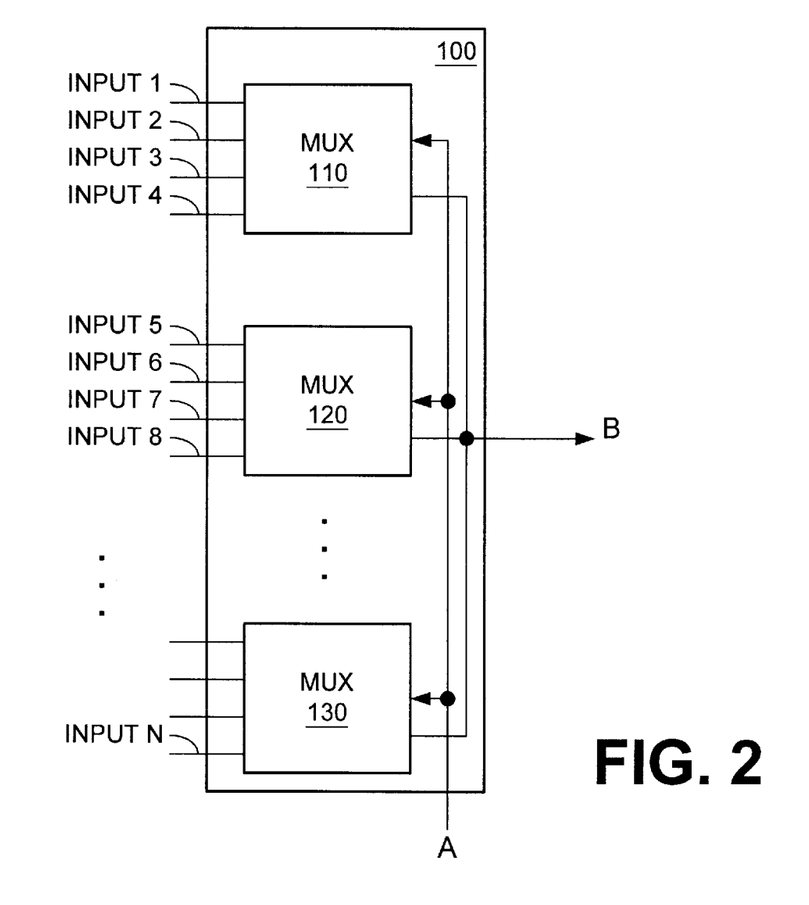
FIG. 2 illustrates a preferred embodiment of a chain selection unit of the present invention.

FIG. 2 illustrates an example of chain selection unit 100. It can be seen that chain selection unit 100 incorporates multiplexers 110, 120 and 130. In this example, each multiplexer 110, 120 and 130 provides for selective input from INPUTS 1 through INPUT N. It will be recognized that additional multiplexing gates can be provided to accommodate additional inputs. Multiplexers 110, 120 and 130 are controlled based upon selection control signal A from select register 710 (FIG. 1). Only one input is selected at a time by the chain select unit 100. However, each input, INPUT 1 through INPUT N, will provide for the input of separate inputs from multiple integrated circuits of similar functional or model type.

Figure 3:
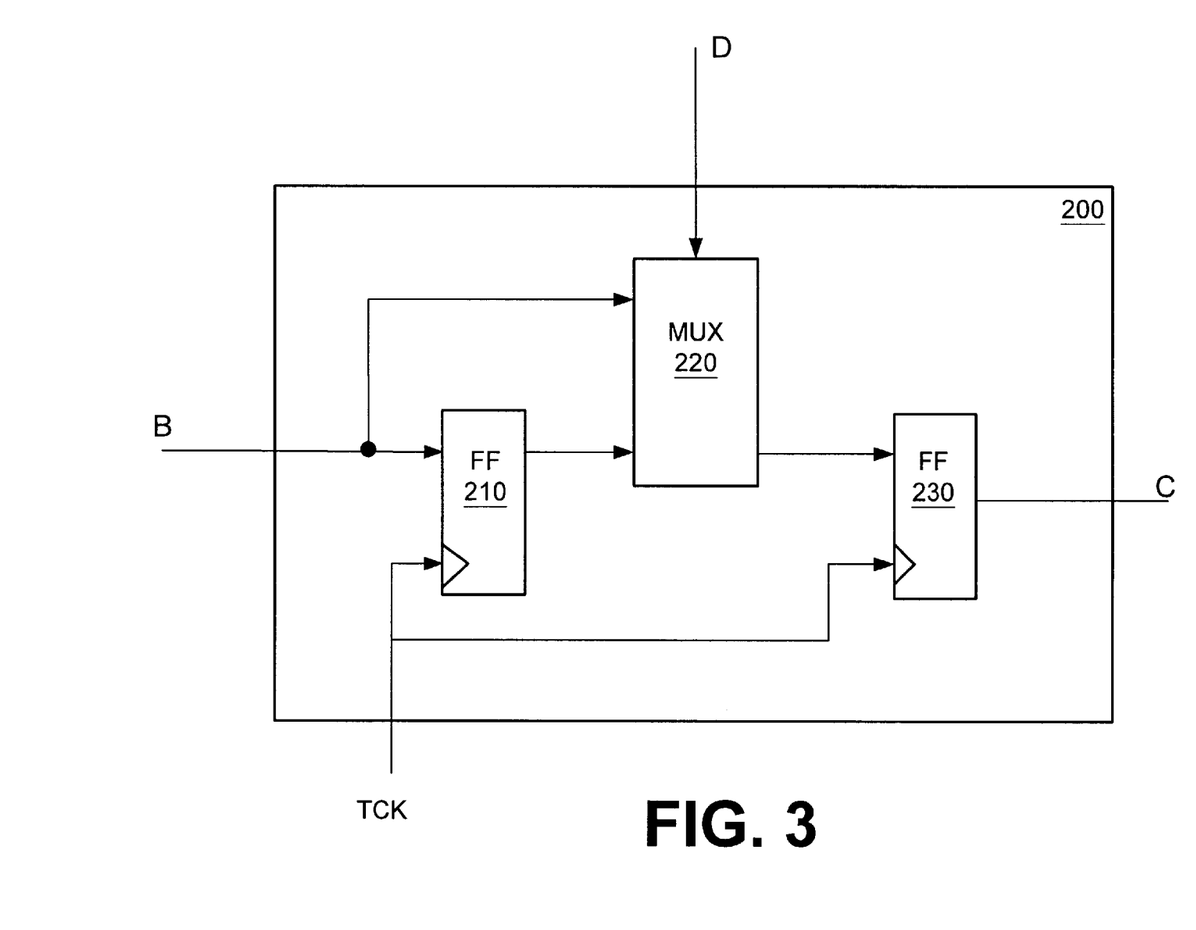
FIG. 3 illustrates a preferred embodiment of a delay adjustment unit of the present invention.

FIG. 3 illustrates an example of a delay adjustment unit 200. The test data output signal B is received and provided to multiplexer 220 and to data flip-flop 210. The output of data flip-flop 210 is also provided to multiplexer 220. Multiplexer 220 is controlled by delay adjustment signal D from delay adjustment register 720 (FIG. 1). Where multiplexer 220 selects the input B for output to data flip-flop 230, test data signal is essentially allowed to pass thru delay adjustment unit 200 without any added delay to be output as adjusted signal C. Alternatively, where the output of data flip-flop 210 is selected by multiplexer 220, delay can be added to the test data signal input so that it can be output as adjusted (synchronized) signal C. It will be recognized that delay adjustment unit 200 will be implemented so as to include circuitry to accommodate the entire group of test data output signals B. Further, it will be understood that additional delay (delay units) could be provided, for example, by increasing the number of available inputs to the multiplexer 220 and by adding additional flip-flops between flip-flop 210 and multiplexer 220.

Comparison control unit 300 (FIG. 4) generates master signal E based upon a predetermined reference signal, adjusted in accordance with instruction data D stored in delay adjust register 720 (FIG. 1). TCK is the clock signal used to clock operations of the parallel test unit. Comparison control unit 300 includes a state machine 340, which receives the JTAG input signal TMS, the system clock signal TCK and the delay adjust signal D from delay adjust register 720 to produce the compare enable signal K. State machine 340 is discussed below with reference to FIG. 9. State machine 340 is preferably compliant with the requirements of IEEE standard 1149.1 and includes a TAP tracker state machine 340a, as well as an enable comparison state machine 340b.

Figure 5:
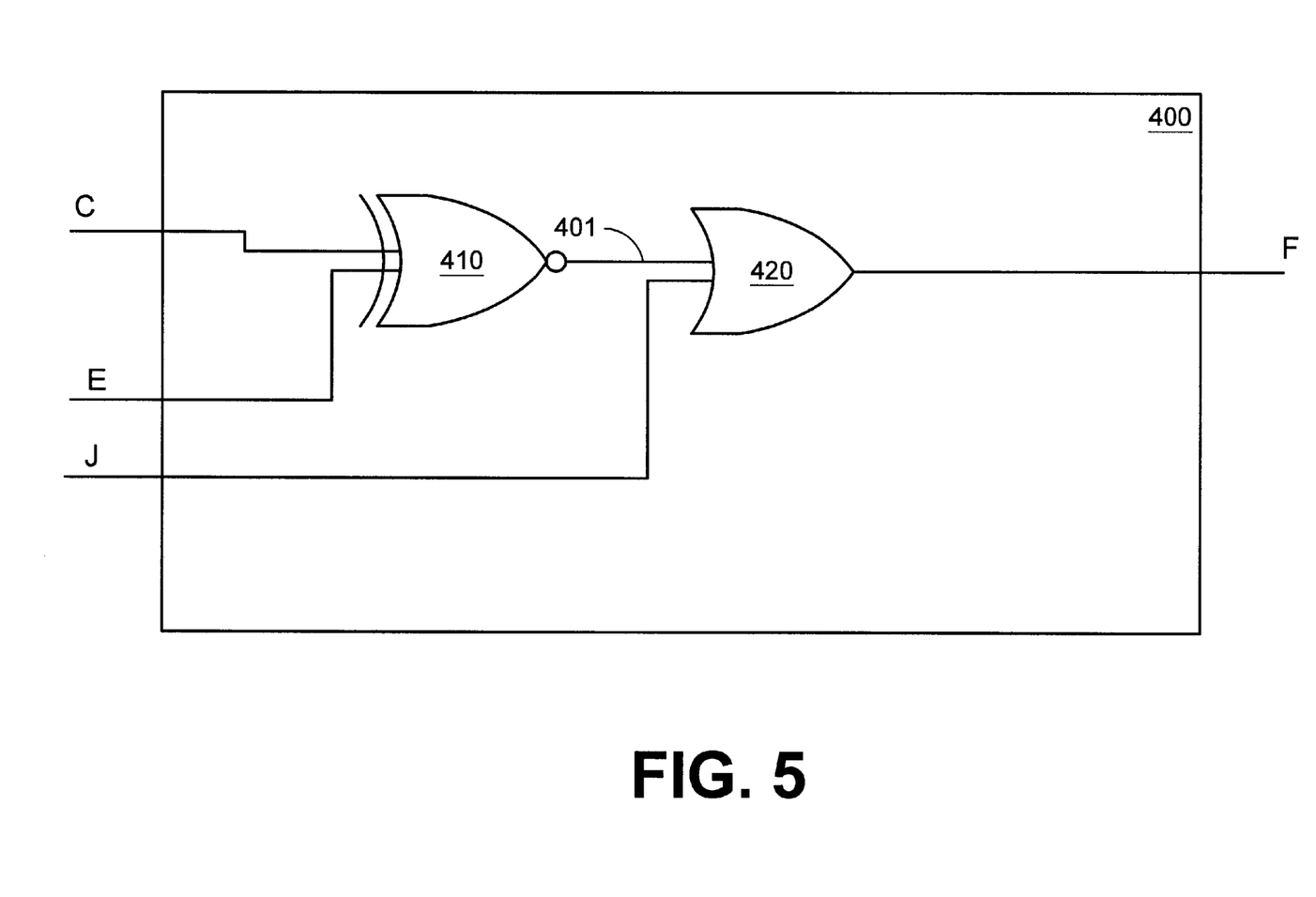
FIG. 5 illustrates a preferred embodiment of a comparator unit of the present invention.

FIG. 5 shows an example of a comparator unit 400. An exclusive NOR gate 410 receives the input of adjusted test data signal C and the master signal E from comparison control unit 300 to produce an interim signal 401. Interim signal 401 is provided to one input of OR gate 420. OR gate 420 receives signal J from ring mask register 740 (FIG. 1). Signal J provides data specifying which test data signals C should be ignored during evaluation/comparison operations. This provides a means of ignoring inputs received from a system in which integrated circuits have been depopulated from the normal system and are, otherwise, not present to output test data output (TDO). The signal J and the interim signal 401 are OR'd together to produce comparison signal F indicating whether or not the adjusted test data output C is the same as the master signal E. Comparison signal F is provided to status collection unit 500 (FIG. 1).

Figure 6:
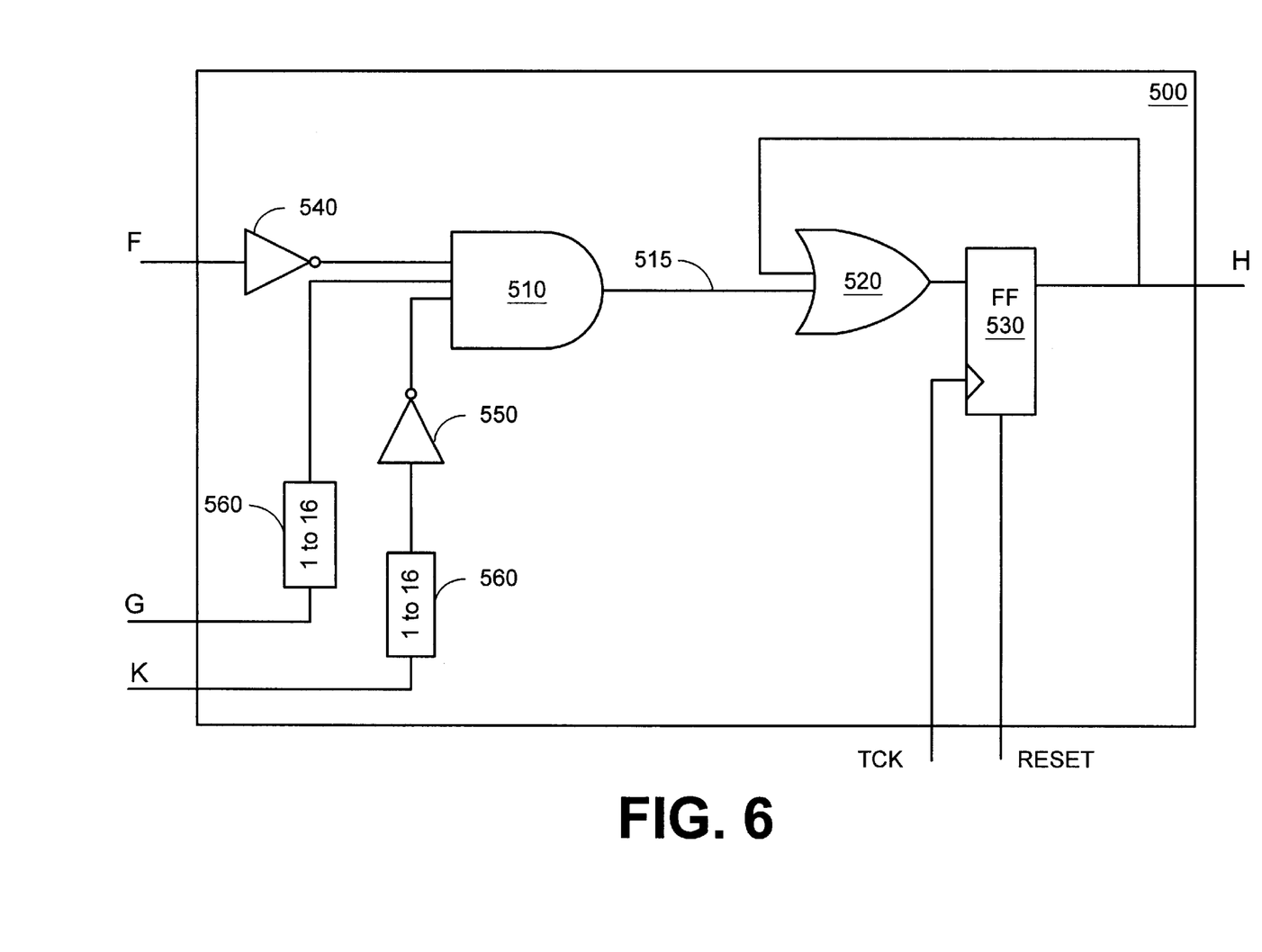
FIG. 6 illustrates a preferred embodiment of a status collection unit of the present invention.

An example of status collection unit 500 is shown in FIG. 6. Status collection unit 500 includes AND gate 510 which receives comparison signal F inverted via inverter 540. The inverted signal F is AND'ed with bit mask shift signal G from shift unit 600 and compare enable signal K from comparison control unit 300 to produce output signal 515 which is provided to one input of OR gate 520. OR gate 520 outputs a signal to data flip-flop 530. Data flip-flop 530 is clocked by clock signal TCK. The output of data flip-flop 530 is provided as signal H, which is output to miscompare register 750 (FIG. 1).

Figure 7:
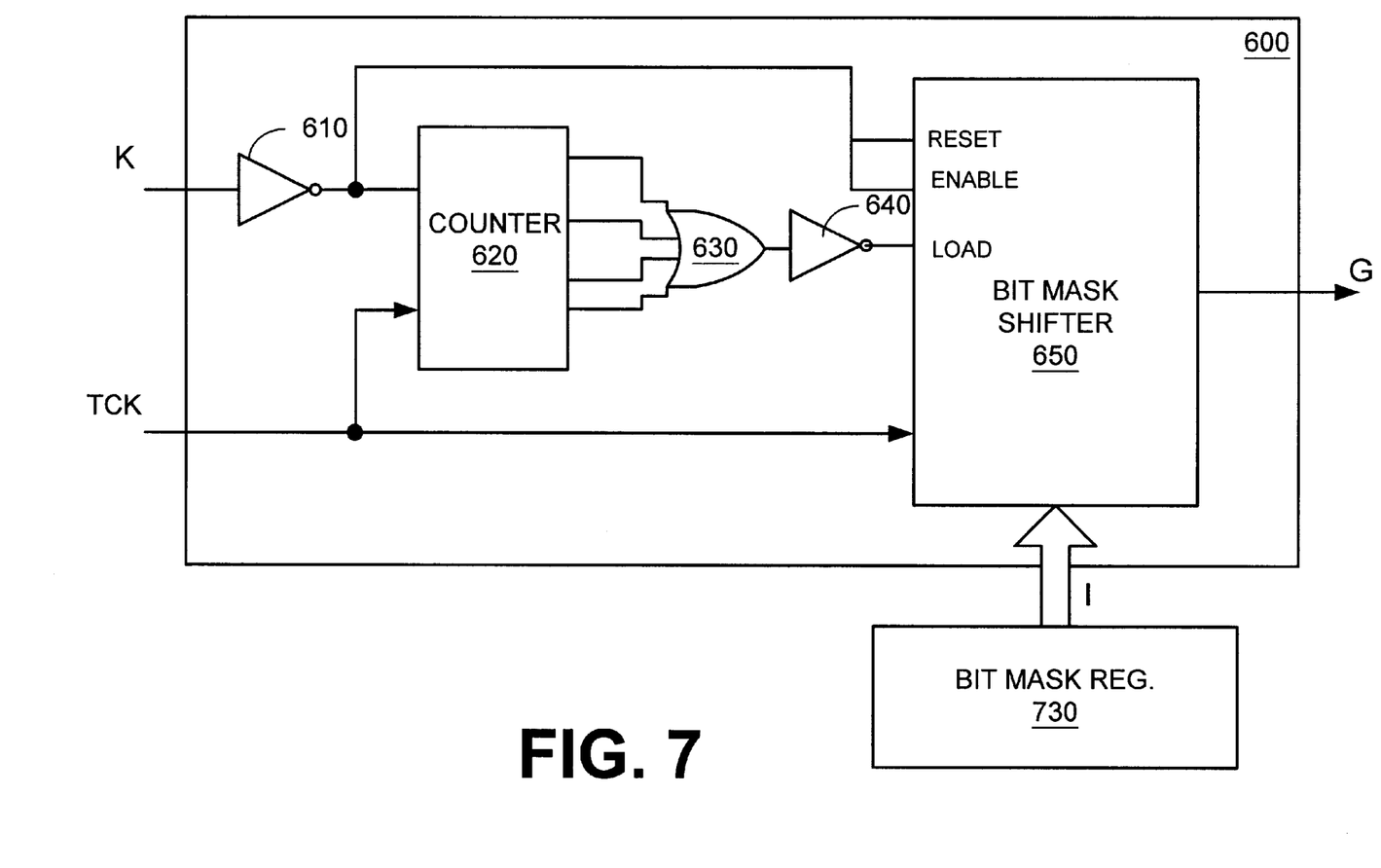
FIG. 7 illustrates a preferred embodiment of a shifter unit of the present invention.

FIG. 7 shows a detailed diagram of a preferred shifter unit 600. The purpose of the shifter unit is to provide a means for ignoring specific comparisons within the stream of TDO data returned from the integrated circuits being tested. This may be necessary if the similar integrated circuits being compared have, for example, one pin that may be different than the others due to some external interface that varies on each integrated circuit instance. As depicted in FIG. 7, compare enable signal K is input from comparison control unit 300 and inverted by inverter 610. The inverted signal is then provided to counter 620 and to the enable line of bit mask shifter 650 to enable the serial shifting of a word (multiple bits) contained within 650 into the status collection unit 500 (FIG. 1). Counter 620 is preferably a roll over counter. After it has counted to its highest value, it returns to zero and begins counting again. When it reaches zero, all inputs to the OR gate 630 are false and the signal from OR gate 630 is also false. As a result, the input to invertor 640 is false and invertor 640's output is true, which causes the bit mask shifter 650 to parallel load the value contained in Bit mask register 740. This assumes that Bit Mask Register 740 is periodically reloaded with new shift data. Bit mask shifter 650 generates signal G, which is provided to status collection unit 500.

Figure 8:
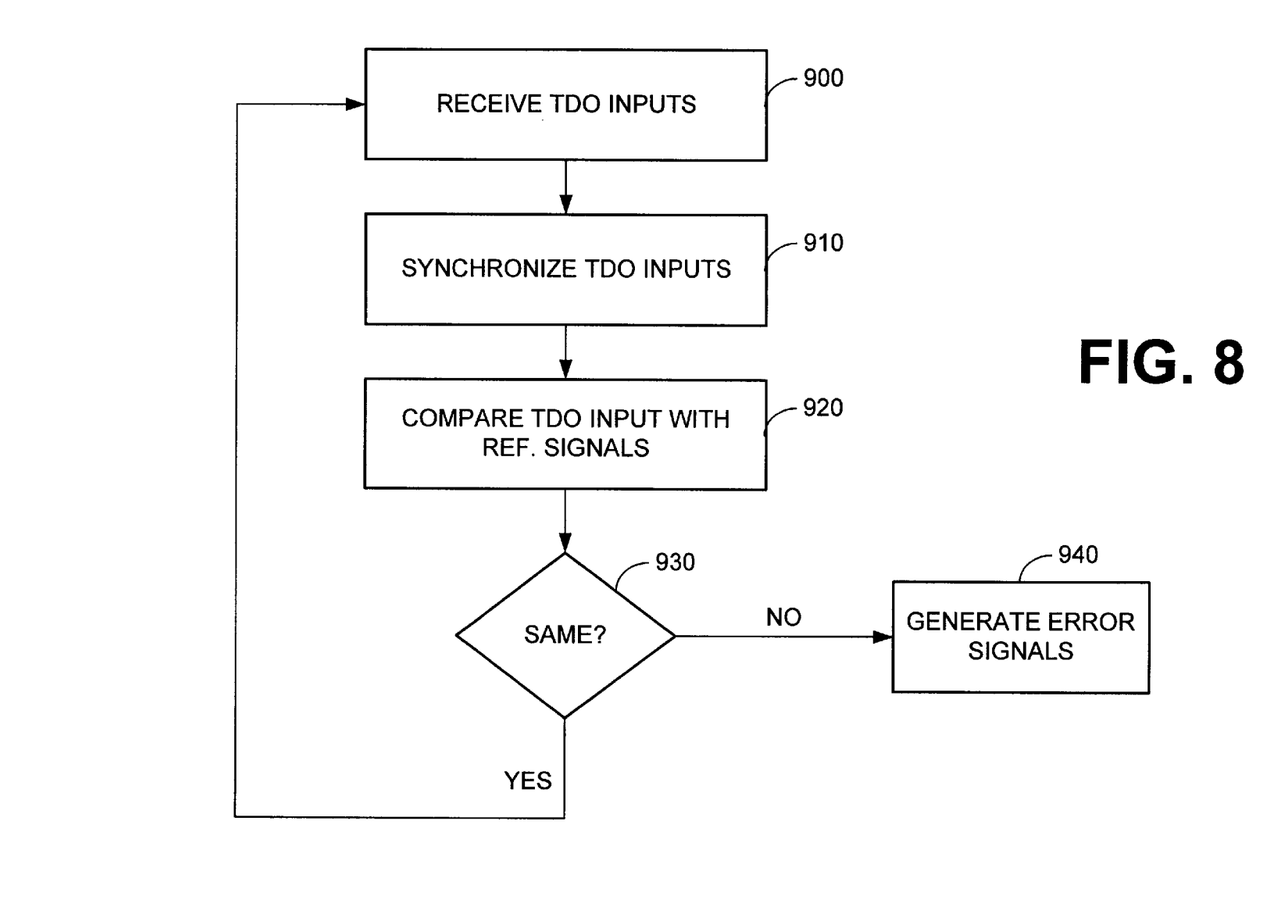
FIG. 8 is a flowchart illustrating a preferred method of the present invention.

FIG. 8 is a flowchart illustrating a preferred method of the present invention. The TDO outputs from the integrated circuits of a particular type are received (900) and then synchronized (or expected results) (910). The received TDO signals are then compared to a master reference signal (920). Where the TDO signal is not the same as the master reference signal, an error signal is generated and output (940).

Figure 9:
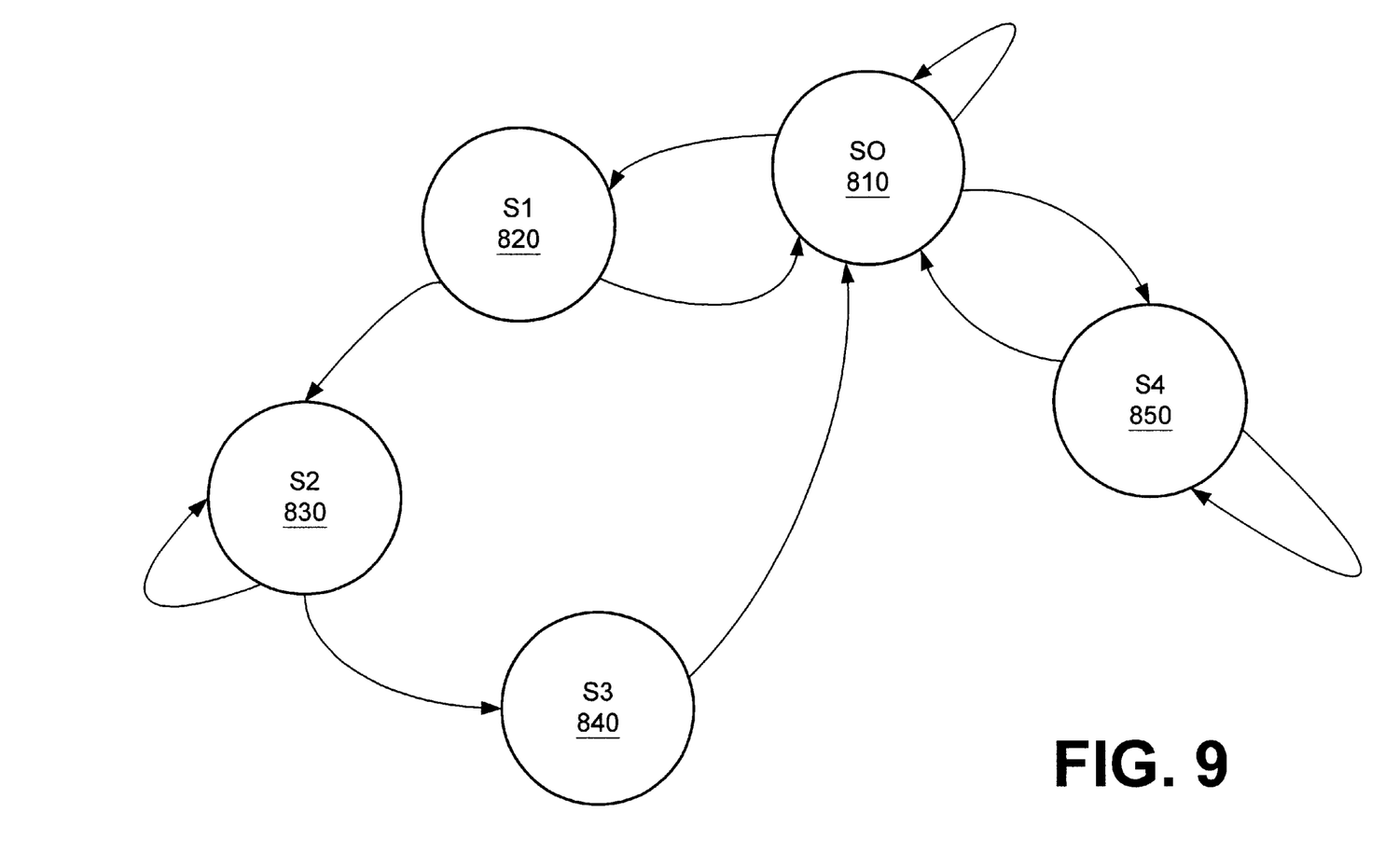
FIG. 9 is a diagram illustrating preferred functionality of state machine 340.

FIG. 9 is a diagram illustrating various states for state machine 340. State machine 340, and, more particularly, enable comparison state machine 340b, generates a compare enable signal K based upon input of shift-IR/DR signal X from TAP state machine 340a (FIG. 4) and delay adjust signal D from delay adjust register 720 (FIG. 1). The shift-IR/DR signal X is TRUE when the JTAG state is either "shift-DR" or "shift-IR" as outlined in IEEE standard 1149.1. The disclosure of IEEE standard 1149.1 is hereby incorporated by reference.

Figure 10:
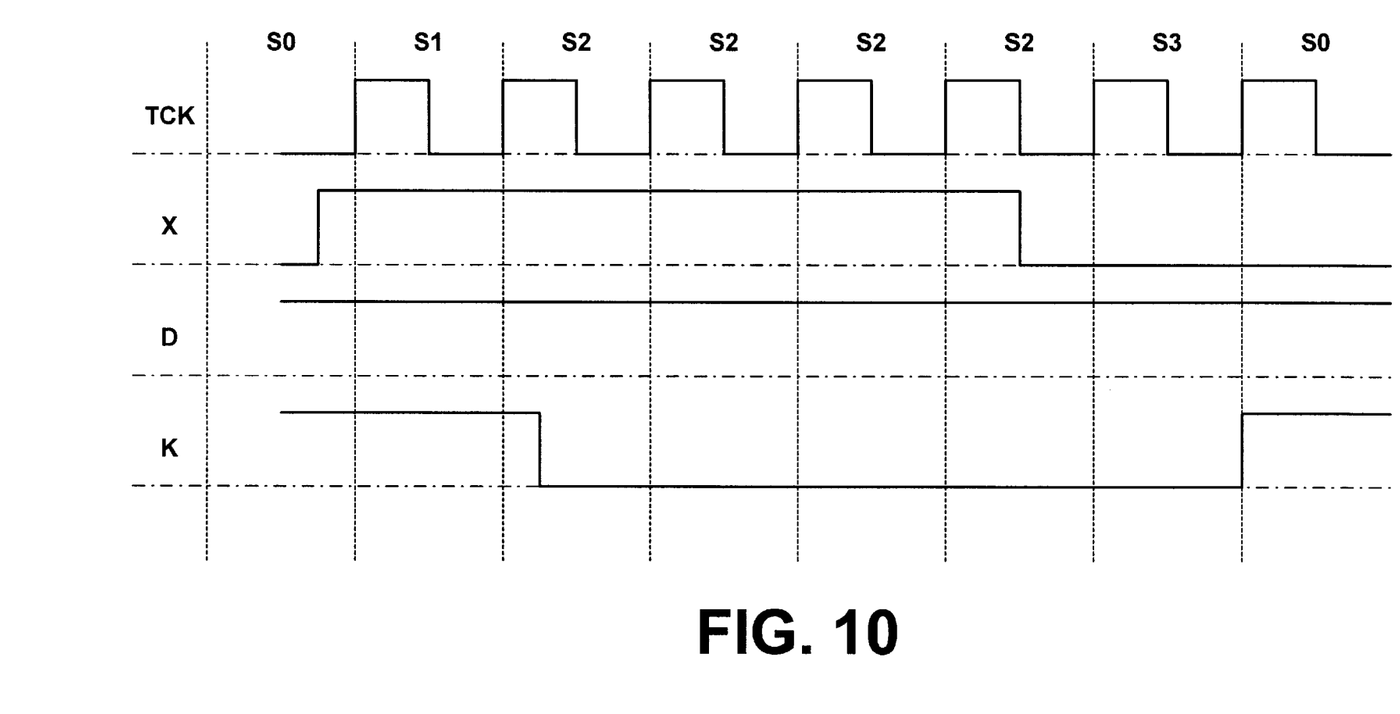
FIG. 10 is a timing diagram illustrating a relation between inputs and output states of state machine 340.
Figure 11:
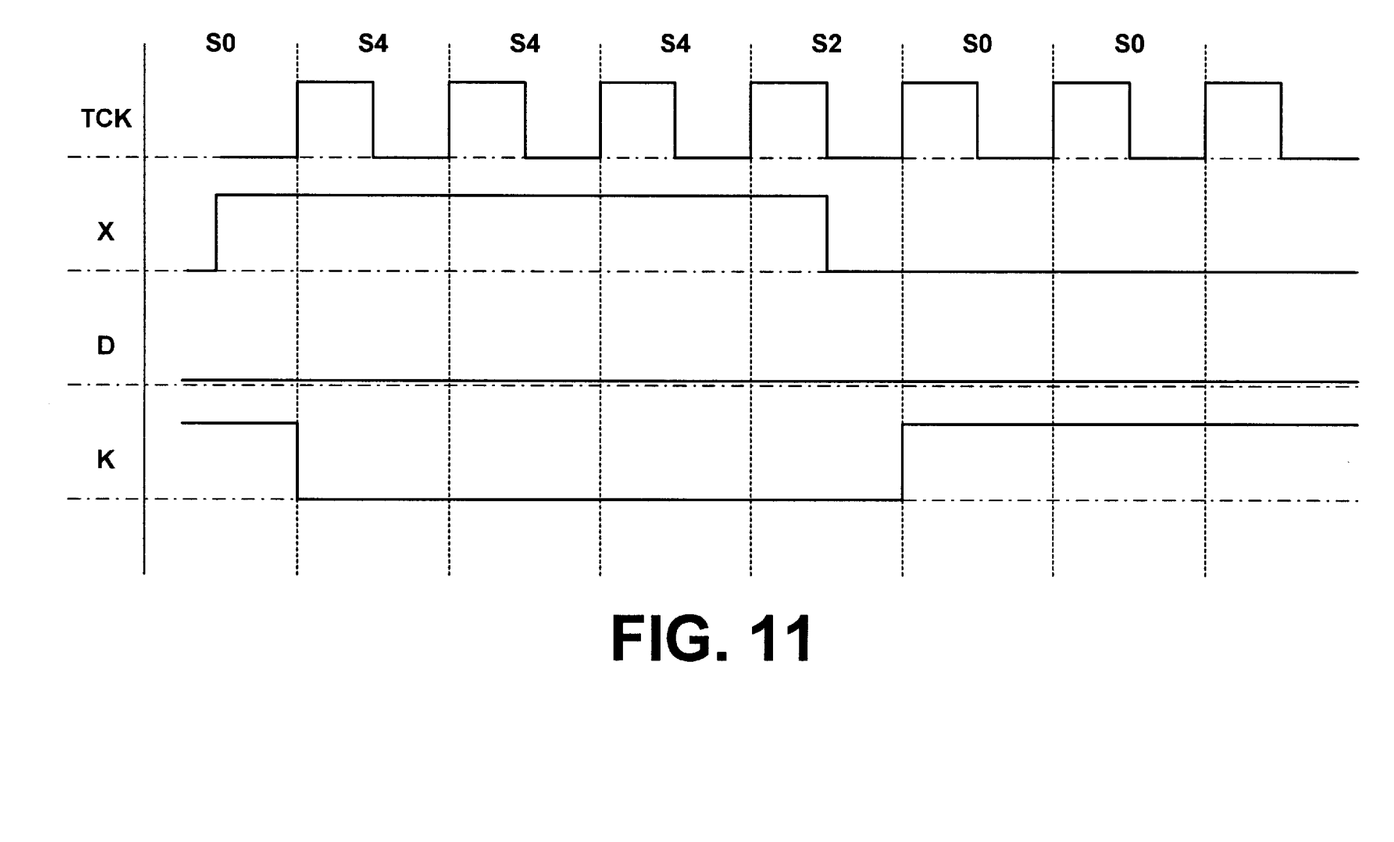
FIG. 11 is a timing diagram illustrating a relation between inputs and output states of state machine 340.

With reference to FIG. 9, FIG. 10 and FIG. 11, the various states of state machine 340 will be described. It will be noted that FIG. 9 and FIG. 10 show the respective sequence and operations of state machine 340 where a delay of one (1) clock cycle is introduced by delay adjustment unit 200 (FIG. 1), while FIG. 9, and FIG. 11, illustrate the case where no delay is introduced by delay adjustment unit 200.

In FIG. 9 and FIG. 10, there are four states illustrated for state machine 340 (340b): S0, S1, S2 and S3. Each state shown correlates to one clock cycle. Further, the states S0 thru S3 correlate to the case where a delay of one clock cycle is introduced by delay adjustment unit 200 via signal D. It should be noted that in the case of additional delay units beyond merely one delay unit, as is illustrated, it will be necessary to provide for a state machine which can provide additional states to correlate to each additional delay unit scenario.

State S0 is an idle state during which the output compare enable signal K of state machine 340 (FIG. 4) remains high (1) as long as shift-IR/DR signal X is FALSE. State S1 is initiated when shift-IR/DR signal X becomes TRUE and delay adjustment signal D is high (1). The duration of State S1 is one clock cycle, as specified by the signal D. On a subsequent clock pulse (TCK), compare enable signal K goes low (0) and state S2 is entered. During state S2, as long as shift-IR/DR signal X remains TRUE, compare enable signal K will remain low (0) and comparison results will be carried out by status collection unit 500. When X goes FALSE, then compare enable signal K remains low (0) for one additional clock cycle and then state machine 340 returns to state S0.

States S0 and S4 correlate to the case where no delay is introduced via delay adjustment unit 200. With reference to FIG. 9 and FIG. 11, it can be seen that state machine 340 is in an idle state S0 while shift-IR/IR signal X is FALSE. During the idle state S0, compare enable signal K is high (1). Where shift-IR/DR signal X goes TRUE and delay adjustment signal D is low (0), the sample state S4 is entered and compare enable signal K goes low (0). As long as shift-IR/DR signal X remains TRUE, state machine 340 remains in a sample state S4 and the compare enable signal K is low (0). Where shift-IR/DR signal X goes FALSE, the compare enable signal K goes high (1) and the state machine 340 returns to the idle state S0.

It will be understood that the provisions described herein must be replicated for each integrated circuit to be simultaneously tested. For example, where INPUT 1 selects twelve integrated circuits of a particular type for testing, twelve separate channels for input and processing of the integrated circuits must be implemented. It is possible to implement the present invention so as to provide, for example, provisions for testing up to sixteen (16) integrated circuits for each INPUT 1 thru INPUT N, and where there are, for example, only twelve (12) integrated circuits to be tested, disable four of the available 16 channels by not enabling (or disabling) via a signal from, for example, ring mask register 730. Where all 16 integrated circuits are to be tested, all available channels can be enabled.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

What is claimed is:

1. A parallel integrated circuit test unit comprising:
   a chain select unit for receiving a plurality of test data signals from an integrated circuit under evaluation;
   a delay adjustment unit communicatively coupled to said chain select unit and configured to generate an adjusted test clock signal for synchronizing each of the plurality of test data signals; and
   a comparator unit communicatively coupled to said chain select unit and configured to compare each of the plurality of test data signals with a master reference signal.

2. A parallel integrated circuit test unit according to claim 1, wherein said chain select unit comprises a plurality of inputs, each for receiving one of the plurality of test data signals from at least one respective integrated circuit.

3. A parallel integrated circuit test unit according to claim 2, wherein said chain select unit selectively forwards at least one of the plurality of test data signals from the at least one respective integrated circuit.

4. A parallel integrated circuit test unit according to claim 2, wherein said chain select unit selects at least one of the test data signals in accordance with data stored in an input select register.

5. A parallel integrated circuit test unit according to claim 4, wherein said input select register comprises a programmable storage register.

6. A parallel integrated circuit test unit according to claim 1, wherein said chain select unit comprises a multiplexer.

7. A parallel integrated circuit test unit according to claim 1, wherein the plurality of test data signals comprises a test data output (TDO) signal from a an IEEE standard 1149.1-1990 compliant integrated circuit.

8. A parallel integrated circuit test unit according to claim 1, wherein said chain select unit comprises a plurality of multiplexers configured to simultaneously receive a plurality of test data output (TDO) signals from a plurality of integrated circuits.

9. A parallel integrated circuit test unit according to claim 8, wherein said plurality of integrated circuits are of a common type.

10. A parallel integrated circuit test unit according to claim 9, wherein said comparator unit comprises a plurality of comparators, each for receiving a single one of said plurality of TDO signals and comparing said received one of said TDO signals with a reference signal.

11. A parallel integrated circuit test unit according to claim 10, wherein said reference signal comprises a selected one of said TDO signals.

12. A parallel integrated circuit test unit according to claim 1, wherein said test unit is implemented as a single integrated circuit.

13. A method of testing a plurality of integrated circuits comprising:

receiving a plurality of test data signals from a plurality of integrated circuits under evaluation;

adding a delay to the plurality of test data signals to synchronize the plurality of test data signals with a system clock;

selecting a subset of the plurality of test data signals;

simultaneously comparing the subset of the plurality of test data signals with a reference signal; and determining whether each of the test data signals comprising the subset of test data signals is the same as the reference signal.

14. A method of testing a plurality of integrated circuits according to claim 13, wherein the plurality of integrated circuits under evaluation comprise IEEE 1149.1 compliant integrated circuits.

15. A method of testing a plurality of integrated circuits according to claim 14, wherein the plurality of test data signals comprises a test data out (TDO) signal from at least one of said IEEE 1149.1 compliant integrated circuits.

16. A parallel integrated circuit test unit comprising:

means for receiving a plurality of test data signals from an integrated circuit under evaluation;

means for selecting a subset of the plurality of test data signals;

means for synchronizing the subset of the plurality of test data signals responsive to timing delays; and means for comparing the subset of the plurality of test data signals with a master reference signal.

17. A parallel integrated circuit test unit according to claim 16, wherein said means for comparing comprises means for masking select bits of IEEE 1149.1 compliant data.

18. A parallel integrated circuit test unit according to claim 16, wherein said means for selecting comprises means for masking at least one parallel ring.

19. A parallel integrated circuit test unit according to claim 16, wherein said means for receiving comprises data stored in an input select register.

* * * * *